(12) United States Patent
Kwon et al.

(10) Patent No.: US 9,911,475 B1
(45) Date of Patent: Mar. 6, 2018

(54) SEMICONDUCTOR DEVICE WHICH PERFORMS AN ACTIVE OPERATION

(71) Applicant: SK hynix Inc., Icheon-si Gyeonggi-do (KR)

(72) Inventors: Ki Hun Kwon, Seoul (KR); Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/597,795

(22) Filed: May 17, 2017

(30) Foreign Application Priority Data

Oct. 6, 2016 (KR) .................. 10-2016-0129365

(51) Int. Cl.
*G11C 7/12* (2006.01)
*G11C 7/22* (2006.01)

(52) U.S. Cl.
CPC .............. *G11C 7/12* (2013.01); *G11C 7/222* (2013.01)

(58) Field of Classification Search
CPC .... G11C 11/401; G11C 11/406; G11C 29/021
See application file for complete search history.

(56) References Cited

U.S. PATENT DOCUMENTS

| 6,026,041 | A | * | 2/2000 | Suzuki | ............. | G11C 7/12 365/203 |
| 6,091,660 | A | * | 7/2000 | Sasaki | ............. | G11C 8/12 365/230.03 |
| 6,240,045 | B1 | * | 5/2001 | Haraguchi | ....... | G11C 7/1072 365/195 |
| 6,449,204 | B1 | * | 9/2002 | Arimoto | ......... | G11C 7/1045 365/189.09 |
| 2005/0088881 | A1 | * | 4/2005 | Miki | ............. | G11C 5/14 365/189.09 |

FOREIGN PATENT DOCUMENTS

KR   1020160016126 A   2/2016

\* cited by examiner

*Primary Examiner* — Tuan T Nguyen
(74) *Attorney, Agent, or Firm* — William Park & Associates Ltd.

(57) ABSTRACT

A semiconductor device includes an information signal conversion circuit suitable for generating a flag signal from an external control signal in response to an information signal, and an implicit precharge signal generation circuit suitable for generating an implicit precharge signal for performing a precharge operation between successive active operations, in response to the flag signal.

20 Claims, 7 Drawing Sheets

| CS | CA Pins | | | | | | | | | | | | | |
|---|---|---|---|---|---|---|---|---|---|---|---|---|---|---|
| | CA0 | CA1 | CA2 | CA3 | CA4 | CA5 | CA6 | CA7 | CA8 | CA9 | CA10 | CA11 | CA12 | CA13 |
| L | L | R12 | R13 | R14 | R15 | R16 | BA0 | BA1 | BG0 | BG1 | BG2 | CID0 | CID1 | CID2 |
| H | R0 | R1 | R2 | R3 | R4 | R5 | R6 | R7 | R8 | R9 | R10 | R11 | R17 | CID3 |

FIG.6

FIG.7

SEMICONDUCTOR DEVICE WHICH PERFORMS AN ACTIVE OPERATION

CROSS-REFERENCE TO RELATED APPLICATION

The present application claims priority under 35 U.S.C. § 119(a) to Korean Patent Application No. 10-2016-0129365 filed on Oct. 6, 2016 in the Korean Intellectual Property Office, which is incorporated herein by reference in its entirety.

BACKGROUND

1. Technical Field

Embodiments of the present disclosure relate to a semiconductor device which performs an active operation.

2. Related Art

A semiconductor device generates an active command for an active operation, a precharge command for a precharge operation, a read command for a read operation, and a write command for a write operation, by decoding a command inputted from an exterior.

If the active operation is performed, a word line is activated, and the data stored in cells are loaded on bit lines. Data transmission between the bit lines and input/output lines is performed by a read command or a write command. In the case where the active operation, the read operation, and the write operation are performed with data loaded on bit lines and input/output lines, a mis-operation may result. Thus, a precharge operation for precharging the bit lines and the input/output lines to a predetermined voltage level should be performed.

SUMMARY

Various embodiments are directed to a semiconductor device which performs successive active operations.

In an embodiment, a semiconductor device may include: an information signal conversion circuit suitable for generating a flag signal from an external control signal in response to an information signal; and an implicit precharge signal generation circuit suitable for generating an implicit precharge signal for performing a precharge operation between successive active operations, in response to the flag signal.

In an embodiment, a semiconductor device may include: an implicit precharge signal generation circuit suitable for generating an implicit precharge signal for performing a precharge operation between successive active operations, in response to a flag signal which is enabled by an external control signal; and an operation active signal generation circuit suitable for generating an operation active signal from an active command in response to the implicit precharge signal.

According to the embodiments, advantages are provided in that, if successive active commands are inputted, a precharge operation may be performed internally and thus a precharge operation by a separate precharge command may not be needed, whereby it is possible to improve operation speed.

Moreover, according to the embodiments, whether to perform a precharge operation to be performed internally according to successive commands is controlled depending on an external input signal. In this regard, since the external input signal is inputted through an input line which exists, an additional line and input pin are not needed, whereby it is possible to reduce costs and a layout area.

DETAILED DESCRIPTION

Hereinafter, a semiconductor device will be described below with reference to the accompanying drawings through various example embodiments.

Figure 1:
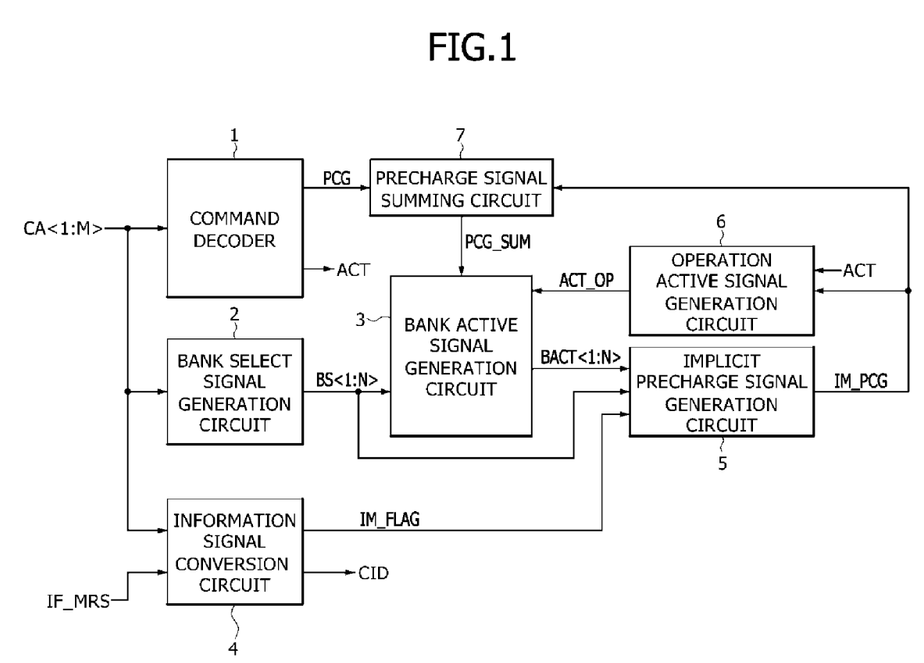
FIG. 1 is a block diagram illustrating a representation of an example configuration of a semiconductor device in accordance with an embodiment.

As shown in FIG. 1, a semiconductor device in accordance with an embodiment may include a command decoder 1, a bank select signal generation circuit 2, a bank active signal generation circuit 3, an information signal conversion circuit 4, an implicit precharge signal generation circuit 5, an operation active signal generation circuit 6, and a precharge signal summing circuit 7.

The command decoder 1 may generate a precharge command PCG and an active command ACT in response to an external control signal CA<1:M>. The command decoder 1 may generate the precharge command PCG and the active command ACT by decoding the external control signal CA<1:M>. The external control signal CA<1:M> may be transmitted through a line through which at least one of a command, an address, and data is transmitted. Bits to be used in generating the precharge command PCG and the active command ACT among the bits included in the external control signal CA<1:M> may be set variously according to embodiments. The precharge command PCG may be enabled for a precharge operation. The active command ACT may be enabled for an active operation. Logic levels at which the precharge command PCG and the active command ACT are enabled may be set variously according to embodiments.

The bank select signal generation circuit 2 may generate a bank select signal BS<1:N> in response to the external control signal CA<1:M>. The bank select signal generation circuit 2 may generate the bank select signal BS<1:N> which includes bits to be enabled selectively, by decoding the external control signal CA<1:M>. Bits to be used in selecting a bank (not shown) among the bits included in the external control signal CA<1:M> may be set variously according to embodiments. The number of bits of the bank select signal BS<1:N> may be set variously according to embodiments. Logic levels at which the bits included in the bank select signal BS<1:N> are enabled may be set variously according to embodiments.

The bank active signal generation circuit 3 may generate a bank active signal BACT<1:N> in response to a summed precharge signal PCG_SUM, an operation active signal ACT_OP, and the bank select signal BS<1:N>. The bank active signal generation circuit 3 may generate the bank active signal BACT<1:N> of which all bits are disabled, if the summed precharge signal PCG_SUM is enabled. The bank active signal generation circuit 3 may generate the bank active signal BACT<1:N> which is selectively enabled by the bank select signal BS<1:N>, if the operation active signal ACT_OP is enabled and the summed precharge signal PCG_SUM disabled. For example, the bank active signal generation circuit 3 may generate a unit bit BACT<P> of the bank active signal BACT<1:N> which is enabled, if a unit bit BS<P> of the bank select signal BS<1:N> is enabled with the summed precharge signal PCG_SUM disabled and with the operation active signal ACT_OP enabled. Bits to be enabled among the bits included in the bank active signal BACT<1:N>, depending on bits to be enabled among the bits included in the bank select signal BS<1:N>, may be set variously according to embodiments. Logic levels at which the bits included in the bank active signal BACT<1:N> are enabled, may be set variously according to embodiments.

The information signal conversion circuit 4 may generate a flag signal IM_FLAG or a chip ID signal CID from the external control signal CA<1:M> in response to an information signal IF_MRS. The information signal conversion circuit 4 may selectively output the external control signal CA<1:M> as the flag signal IM_FLAG or the chip ID signal CID depending on the logic level of the information signal IF_MRS. For example, the information signal conversion circuit 4 may generate the flag signal IM_FLAG which is enabled, from the external control signal CA<1:M>, if the information signal IF_MRS is a logic high level, and may generate the chip ID signal CID which is enabled, from the external control signal CA<1:M>, if the information signal IF_MRS is a logic low level. The information signal IF_MRS may be stored by being set through a mode register set operation. The flag signal IM_FLAG may be enabled to perform an active operation after performing a precharge operation for a predetermined period, if the bank select signal BS<1:N> is inputted to select a bank (not shown) of an active state. Logic levels at which the flag signal IM_FLAG and the chip ID signal CID are enabled may be set variously according to embodiments.

The implicit precharge signal generation circuit 5 may generate an implicit precharge signal IM_PCG in response to the flag signal IM_FLAG, the bank select signal BS<1:N>, and the bank active signal BACT<1:N>. The implicit precharge signal generation circuit 5 may generate the implicit precharge signal IM_PCG which is disabled, if the flag signal IM_FLAG is disabled. The implicit precharge signal generation circuit 5 may generate the implicit precharge signal IM_PCG which is disabled, if a bit among the bits included in the bank select signal BS<1:N>, which corresponds to a bit enabled among the bits included in the bank active signal BACT<1:N>, is disabled with the flag signal IM_FLAG enabled. The implicit precharge signal generation circuit 5 may generate the implicit precharge signal IM_PCG which is enabled, if a bit among the bits included in the bank select signal BS<1:N>, which corresponds to a bit enabled among the bits included in the bank active signal BACT<1:N>, is enabled with the flag signal IM_FLAG enabled. If an activated bank (not shown) is selected again in order to perform an active operation for another word line of a bank in the state in which an active operation is being performed for a specific word line of the bank, an enabled implicit precharge signal IM_PCG is generated to perform the active operation after a precharge operation is performed without generating the precharge command PCG. A logic level at which the implicit precharge signal IM_PCG is enabled may be set variously according to embodiments. Further, in one example, the implicit precharge signal generation circuit 5 may generate the implicit precharge signal IM_PCG for performing a precharge operation between successive active operations, in response to the flag signal IM_FLAG, which may be enabled by an external control signal CA<1:M>.

The operation active signal generation circuit 6 may generate the operation active signal ACT_OP from the active command ACT in response to the implicit precharge signal IM_PCG. The operation active signal generation circuit 6 may generate the operation active signal ACT_OP which is enabled, if the active command ACT is enabled with the implicit precharge signal IM_PCG disabled. The operation active signal generation circuit 6 may generate the operation active signal ACT_OP which is enabled when a predetermined period passes from when the implicit precharge signal IM_PCG is enabled, if the implicit precharge signal IM_PCG is enabled with the active command ACT enabled. The operation active signal generation circuit 6 generates the operation active signal ACT_OP which is enabled after a period for a precharge operation is secured, if the implicit precharge signal IM_PCG is enabled. A logic level at which the operation active signal ACT_OP is enabled may be set variously according to embodiments.

The precharge signal summing circuit 7 may generate the summed precharge signal PCG_SUM in response to the precharge command PCG and the implicit precharge signal IM_PCG. The precharge signal summing circuit 7 may generate the summed precharge signal PCG_SUM by summing the implicit precharge signal PCG_SUM and a precharge command PCG where the summed precharge signal PCG_SUM may be enabled if at least one of the precharge command PCG and the implicit precharge signal IM_PCG is enabled. A logic level at which the summed precharge signal PCG_SUM is enabled may be set variously according to embodiments.

Figure 2:
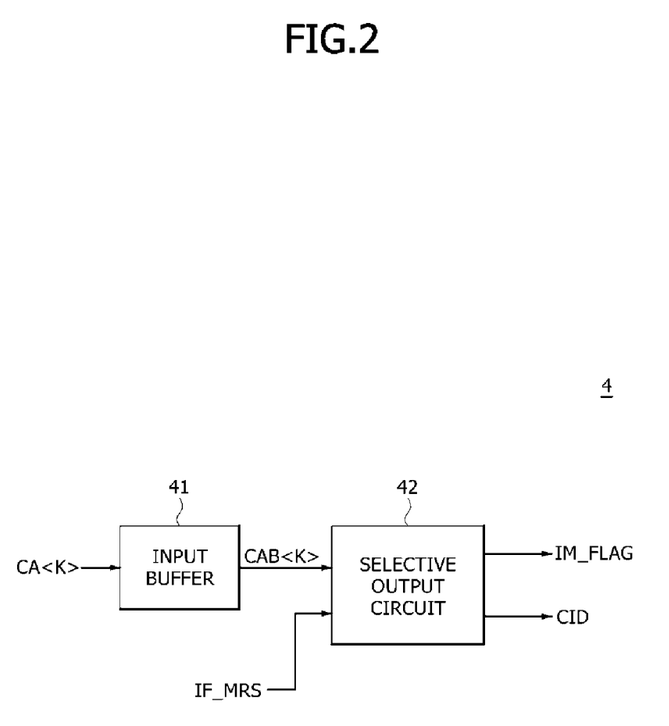
FIG. 2 is a block diagram illustrating a representation of an example configuration of an information signal conversion circuit included in the semiconductor device shown in FIG. 1.

Referring to FIG. 2, the information signal conversion circuit 4 may include an input buffer 41 and a selective output circuit 42.

The input buffer 41 may generate a control bit CAB<K> in response to a unit bit CA<K> of the external control signal CA<1:M>. The input buffer 41 may output the control bit CAB<K> by buffering the unit bit CA<K> of the external control signal CA<1:M>.

The selective output circuit 42 may generate the flag signal IM_FLAG or the chip ID signal CID from the control bit CAB<K> in response to the information signal IF_MRS. The selective output circuit 42 may output the control bit CAB<K> selectively as the flag signal IM_FLAG or the chip ID signal CID depending on the logic level of the information signal IF_MRS.

Figure 3:
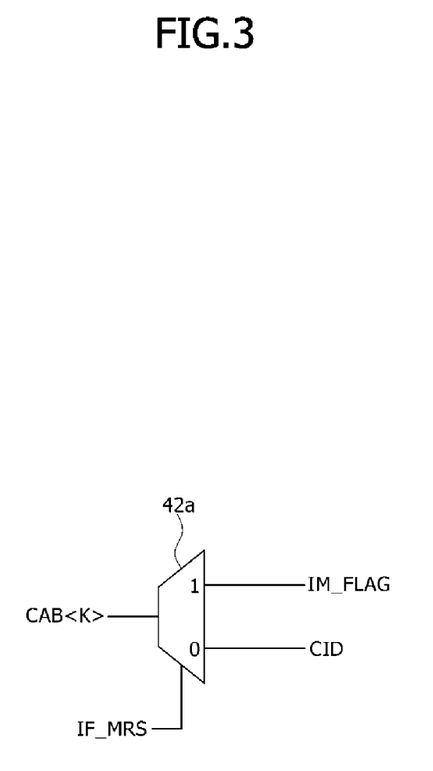
FIG. 3 is a circuit diagram illustrating a representation of an example selective output circuit included in the information signal conversion circuit shown in FIG. 2.

Referring to FIG. 3, a selective output circuit 42a may be realized by a multiplexer circuit. The selective output circuit 42a may output the control bit CAB<K> as the flag signal IM_FLAG if the information signal IF_MRS is the logic high level, or output the control bit CAB<K> as the chip ID signal CID if the information signal IF_MRS is the logic low level.

Figure 4:
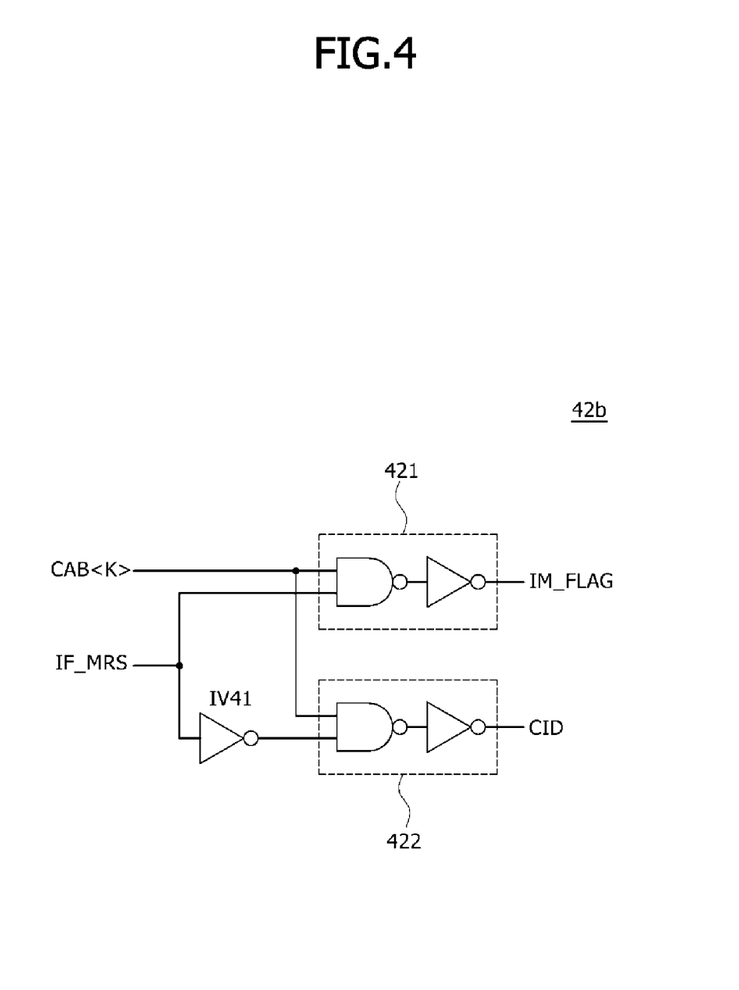
FIG. 4 is a circuit diagram illustrating a representation of another example of a selective output circuit included in the information signal conversion circuit shown in FIG. 2.

Referring to FIG. 4, another embodiment of a selective output circuit 42b may include an inverter IV41, a first output buffer 421, and a second output buffer 422. The selective output circuit 42b may output the flag signal IM_FLAG by buffering the control bit CAB<K> through the first output buffer 421 if the information signal IF_MRS is the logic high level, and output the chip ID signal CID by buffering the control bit CAB<K> through the second output buffer 422 if the information signal IF_MRS is the logic low level.

Figure 5:
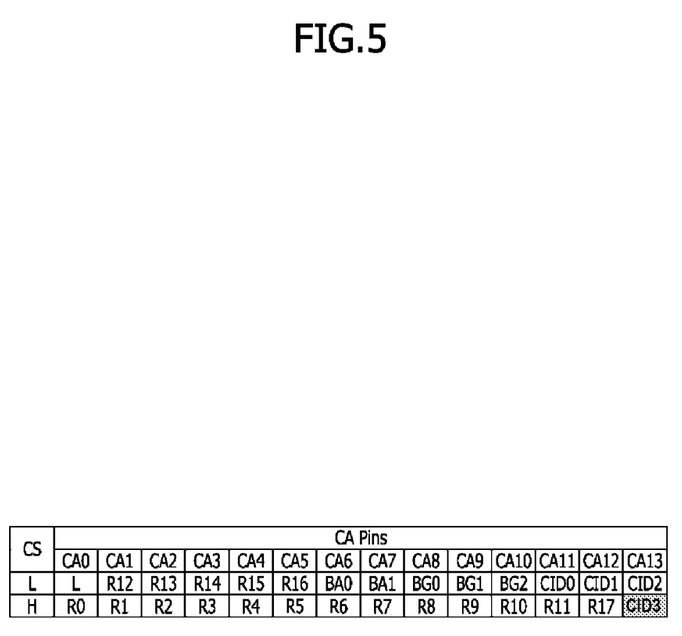
FIG. 5 is a table showing a representation of an example of signals to be inputted through an external control signal according to a Joint Electronic Device Engineering Council specification.

Referring to FIG. 5, signals inputted through an external control signal CA<0:13> according to the Joint Electronic Device Engineering Council (JEDEC) specification may be checked. In a state in which a chip select signal CS is a logic low level, a logic low level L, row addresses R12, R13, R14, R15 and R16, bank addresses BA0 and BA1, bank group signals BG0, BG1 and BG2 and chip ID signals CID0, CID1 and CID2 may be inputted through the external control signal CA<0:13>. In the state in which the chip select signal CS is a logic high level row addresses R0, R1, R2, R3, R4, R5, R6, R7, R8, R9, R10, R11 and R17 and a chip ID signal CID3 may be inputted through the external control signal CA<0:13>. In the present embodiment, in the state in which the chip select signal CS is the logic high level, the bit CA<13> included in the external control signal CA<0:13>, which is used as the chip ID signal CID3, may be used in generating the flag signal IM_FLAG depending on the logic level of the information signal IF_MRS.

Figure 6:
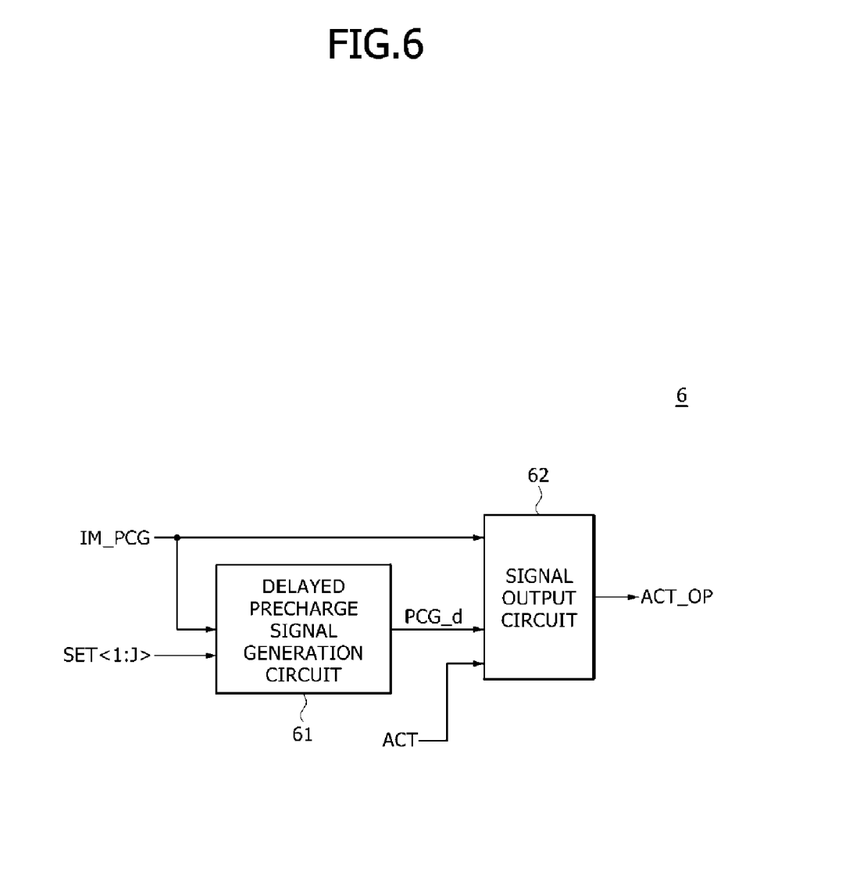
FIG. 6 is a block diagram illustrating a representation of an example configuration of an operation active signal generation circuit included in the semiconductor device shown in FIG. 1.

Referring to FIG. 6, the operation active signal generation circuit 6 may include a delayed precharge signal generation circuit 61 and a signal output circuit 62.

The delayed precharge signal generation circuit 61 may generate a delayed precharge signal PCG_d from the implicit precharge signal IM_PCG in response to a set signal SET<1:J>. The delayed precharge signal generation circuit 61 may generate the delayed precharge signal PCG_d by delaying the implicit precharge signal IM_PCG for a delay period set according to the set signal SET<1:J>. The delay period set by the logic level combination of the set signal SET<1:J> may be set variously according to embodiments.

The signal output circuit 62 may generate the operation active signal ACT_OP in response to the implicit precharge signal IM_PCG, the active command ACT, and the delayed precharge signal PCG_d. The signal output circuit 62 may generate the operation active signal ACT_OP which is enabled when the delayed precharge signal PCG_d is enabled, if the active command ACT is enabled with the implicit precharge signal IM_PCG enabled.

The operation of the semiconductor device configured as mentioned above will be described below by being divided into a case where the flag signal IM_FLAG is disabled based on the external control signal CA<1:M> and a case where the flag signal IM_FLAG is enabled based on the external control signal CA<1:M>.

If flag signal IM_FLAG is set to the disabled state depending on the external control signal CA<1:M>, the implicit precharge signal IM_PCG is disabled. If the implicit precharge signal IM_PCG is disabled to perform successive active operations, after an active operation is performed by a first active command ACT and a precharge operation is performed by the precharge command PCG, an active operation should be performed by a second active command ACT. In other words, in order to remove an influence that is exerted on a next active operation by the data loaded on bit lines and input/output lines in an active operation, a precharge operation is needed, and to this end, the precharge command PCG should be generated.

If successive active operations are performed in the state in which the flag signal IM_FLAG is set to the enabled state depending on the external control signal CA<1:M>, the implicit precharge signal IM_PCG is enabled. Namely, when a first and second active operation are performed, if the second active operation is to be performed for a bank for which the first active operation is being performed, the implicit precharge signal IM_PCG is enabled without the need for generating the precharge command PCG. As the implicit precharge signal IM_PCG is enabled, a precharge operation is performed, and a second active operation is performed after a predetermined period passes.

As is apparent from the above descriptions, in the semiconductor device according to an embodiment, successive active operations may be performed without the need of generating a precharge command, depending on the external control signal CA<1:M>, whereby it is possible to improve operation speed. Also, because the external control signal CA<1:M> is inputted through an existing line through which an address and a command are inputted, an additional line and input pin are not needed, whereby it is possible to reduce costs and a layout area.

The semiconductor device described above with reference to FIGS. 1 to 6 may be applied to an electronic system which includes a memory system, a graphic system, a computing system or a mobile system. For example, referring to FIG. 7, an electronic system 1000 in accordance with an embodiment may include a data storage 1001, a memory controller 1002, a buffer memory 1003, and an input/output interface 1004.

Figure 7:
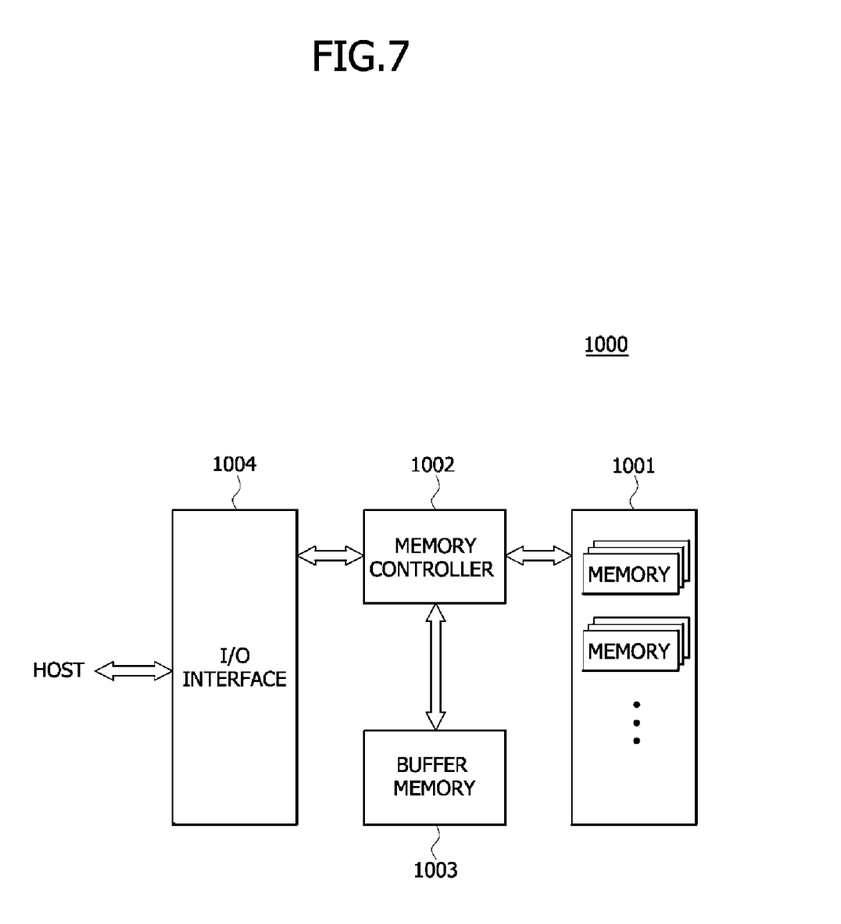
FIG. 7 is a diagram illustrating a representation of an example configuration of an electronic system to which the semiconductor device shown in FIG. 1 is applied.

The data storage 1001 stores data applied from the memory controller 1002, and reads out the stored data and outputs the read-out data to the memory controller 1002, according to control signals from the memory controller 1002. The data storage 1001 may include the semiconductor device shown in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 7, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
an information signal conversion circuit suitable for generating a flag signal from an external control signal in response to an information signal; and
an implicit precharge signal generation circuit suitable for generating an implicit precharge signal for performing a precharge operation between successive active operations, in response to the flag signal.

2. The semiconductor device according to claim 1, wherein the information signal is stored by being set through a mode register set operation.

3. The semiconductor device according to claim 1, wherein the external control signal is able to be inputted through a line through which at least one of a command, an address, and data is transmitted.

4. The semiconductor device according to claim 1, wherein the information signal conversion circuit outputs a bit selected from the external control signal, selectively as the flag signal or a chip ID signal, depending on a logic level of the information signal.

5. The semiconductor device according to claim 1, wherein the implicit precharge signal generation circuit generates the implicit precharge signal in response to the flag signal, a bank select signal and a bank active signal.

6. The semiconductor device according to claim 5, wherein the implicit precharge signal is disabled if the flag signal is disabled.

7. The semiconductor device according to claim 5, wherein in the performance of a first and second active operation, the implicit precharge signal is enabled if the flag signal is enabled and the bank select signal is enabled by a second active operation in a state in which the back active signal is enabled by a first active operation.

8. The semiconductor device according to claim 5, further comprising:
a precharge signal summing circuit suitable for generating a summed precharge signal by summing the implicit precharge signal and a precharge command.

9. The semiconductor device according to claim 5, further comprising:

a bank active signal generation circuit suitable for generating the bank active signal in response to the bank select signal, an operation active signal and the summed precharge signal.

10. The semiconductor device according to claim 5, further comprising:
an operation active signal generation circuit suitable for generating the operation active signal from an active command in response to the implicit precharge signal.

11. The semiconductor device according to claim 10, wherein the operation active signal generation circuit generates the operation active signal which is enabled when a predetermined period passes from time when the implicit precharge signal is enabled, if the implicit precharge signal is enabled with the active command enabled.

12. The semiconductor device according to claim 10, wherein the operation active signal generation circuit comprises:
a delayed precharge signal generation circuit suitable for generating a delayed precharge signal by delaying the implicit precharge signal for a delay period set according to a set signal; and
a signal output circuit suitable for generating the operation active signal in response to the active command, the implicit precharge signal, and the delayed precharge signal.

13. A semiconductor device comprising:
an implicit precharge signal generation circuit suitable for generating an implicit precharge signal for performing a precharge operation between successive active operations, in response to a flag signal which is enabled by an external control signal; and
an operation active signal generation circuit suitable for generating an operation active signal from an active command in response to the implicit precharge signal.

14. The semiconductor device according to claim 13, wherein the external control signal is able to be inputted through a line through which at least one of a command, an address, and data is transmitted.

15. The semiconductor device according to claim 13, wherein the external control signal is outputted selectively as the flag signal or a chip ID signal depending on an information signal of which logic level is set through a mode register set operation.

16. The semiconductor device according to claim 13, wherein the implicit precharge signal generation circuit generates the implicit precharge signal in response to the flag signal, a bank select signal and a bank active signal.

17. The semiconductor device according to claim 13, wherein in the performance of a first and second active operation, the implicit precharge signal is disabled if the flag signal is disabled, and is enabled if the flag signal is enabled and the bank select signal is enabled by a second active operation in a state in which the back active signal is enabled by a first active operation.

18. The semiconductor device according to claim 13, wherein the implicit precharge signal generation circuit generates the implicit precharge signal in response to the flag signal, a bank select signal and a bank active signal, and
wherein the semiconductor device further comprises:
a bank active signal generation circuit suitable for generating the bank active signal in response to the operation active signal, the bank select signal and a summed precharge signal.

19. The semiconductor device according to claim 13, wherein the operation active signal generation circuit generates the operation active signal which is enabled when a predetermined period passes from a time when the implicit precharge signal is enabled, if the implicit precharge signal is enabled with the active command enabled.

20. The semiconductor device according to claim 13, wherein the operation active signal generation circuit comprises:
- a delayed precharge signal generation circuit suitable for generating a delayed precharge signal by delaying the implicit precharge signal for a delay period set according to a set signal; and
- a signal output circuit suitable for generating the operation active signal in response to the active command, the implicit precharge signal and the delayed precharge signal.

* * * * *